United States Patent
Torin et al.

(10) Patent No.: US 9,651,646 B2
(45) Date of Patent: May 16, 2017

(54) PHASE NOISE CORRECTION SYSTEM FOR DISCRETE TIME SIGNAL PROCESSING

(71) Applicant: Tektronix, Inc., Beaverton, OR (US)

(72) Inventors: Shigetsune Torin, Beaverton, OR (US); Thomas C. Hill, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 76 days.

(21) Appl. No.: 14/313,744

(22) Filed: Jun. 24, 2014

(65) Prior Publication Data

US 2015/0369898 A1 Dec. 24, 2015

(51) Int. Cl.
*G01R 35/00* (2006.01)
*G01R 13/02* (2006.01)
*G01R 29/26* (2006.01)
*G01R 31/317* (2006.01)
*G01R 25/00* (2006.01)
*G01R 31/28* (2006.01)

(52) U.S. Cl.
CPC ....... *G01R 35/005* (2013.01); *G01R 13/0218* (2013.01); *G01R 25/00* (2013.01); *G01R 29/26* (2013.01); *G01R 31/28* (2013.01); *G01R 31/31709* (2013.01)

(58) Field of Classification Search
None
See application file for complete search history.

(56) References Cited

U.S. PATENT DOCUMENTS

| | | | | |
|---|---|---|---|---|
| 5,162,723 A | * | 11/1992 | Marzalek | G01R 23/16 324/121 R |
| 6,564,160 B2 | | 5/2003 | Jungerman et al. | |
| 6,621,277 B2 | * | 9/2003 | Mar | G01R 29/26 324/622 |
| 7,317,999 B2 | * | 1/2008 | Ninomiya | G01R 23/167 381/92 |
| 7,746,058 B2 | | 6/2010 | Nelson et al. | |
| 2005/0096859 A1 | * | 5/2005 | Torin | G01R 29/26 702/69 |
| 2010/0261434 A1 | * | 10/2010 | Arai | H03J 7/04 455/73 |

OTHER PUBLICATIONS

Grove, J. et al: "Direct-Digital Phase-Noise Measurement", IEEE International Ultrasonics, Ferroelectrics, and Frequency Control Joint 50th Anniversary Conference, 2004, pp. 287-291.

* cited by examiner

*Primary Examiner* — Jermele M Hollington
*Assistant Examiner* — Douglas X Rodriguez
(74) *Attorney, Agent, or Firm* — Michael A. Nelson; Kevin D. Dothager; Marger Johnson

(57) ABSTRACT

Embodiments of the invention include a test and measurement instrument including a test signal input and a sampler coupled to the test signal input to generate a sampled test signal. The instrument also includes a noise reduction system that includes an additional oscillator coupled to the sampler and structured to generate a sampled oscillating signal, as well as a phase detector coupled to the sampled oscillating signal for measuring noise introduced by the sampler. The noise reduction system further includes a phase corrector coupled to the phase detector for removing the measured amount of noise from the sampled test signal. Methods of noise detection are also described.

14 Claims, 7 Drawing Sheets

PHASE NOISE CORRECTION SYSTEM FOR DISCRETE TIME SIGNAL PROCESSING

FIELD OF THE INVENTION

This disclosure is directed to discrete time signal processing, and more particularly, to a phase noise correction system to mitigate phase noise generated by a discrete time receiver or other discrete time testing equipment.

BACKGROUND

Discrete time processing receivers are now common due to advance of high data rate sampling devices and digital signal processing. To measure the phase property of a Radio Frequency (RF) signal, the receiver should have much less phase noise than the RF signal itself. Usually, internal oscillation systems such as local oscillators and jitter of the internal sampling clock are the major causes of phase noise.

Some receivers have one or more frequency conversion stages. One example of a receiver is a Real Time Spectrum Analyzer (RTSA) available from Tektronix, Inc. of Beaverton, Oreg. In the RTSA, the phase noise of the local oscillator for the frequency converter is added to the received signal. Continuous signals are periodically sampled in discrete time processing receivers. The sampler is driven by an oscillator clock, which contains some timing jitter. The jitter is converted to additional phase noise by the sampler. Overall, the received signals are affected by many phase noise sources. Improving internal oscillators is a significant cost trade-off issue particularly with wide-range high-frequency synthesized oscillation systems. It is difficult, though, to produce oscillators having low noise for low cost.

Earlier attempts to reduce phase noise are shown in U.S. Pat. No. 7,746,058 to Nelson et al, and U.S. Pat. No. 6,564,160 Jungerman et al. Additional techniques are revealed in a published paper by Grove et al, entitled "Direct-Digital Phase-Noise Measurement" 2004 IEEE International Ultrasonics, Ferroelectrics and Frequency Control Joint 50th Anniversary Conference," 2004.

The '058 patent describes a "Sequential Equivalent Time Sampling" system. The system includes variations on whether the trigger and the reference are synchronous with or are related to the DUT signal. In the disclosed methods, the reference signal must be digitized separately from the DUT signal, and includes complex method of converting the reference signal into "time stamps" that are used to correct the DUT samples. This is a complicated system.

The '160 patent uses a clock reference that is generated from or directly related directly to the DUT, or is provided by the DUT itself. The sampling of the DUT and reference are synchronous, and there is no mechanism for using a phase reference that is asynchronous to the DUT signal, which limits its application.

The Grove paper describes a "Phase Noise Test Set", that can only measure the phase noise of an incoming signal. This has no ability to measure other parameters of a signal, to display a waveform, and not to be a receiver for demodulation signals.

Embodiments of the invention address these and other issues in the prior art.

SUMMARY OF THE DISCLOSURE

Embodiments of the invention include a test and measurement instrument including a test signal input and a sampler coupled to the test signal input to generate a sampled test signal. The instrument also includes a noise reduction system that includes an additional oscillator coupled to the sampler and structured to generate a sampled oscillating signal, as well as a phase detector coupled to the sampled oscillating signal for measuring noise introduced by the sampler. The noise reduction system further includes a phase corrector coupled to the phase detector for removing the measured amount of noise from the sampled test signal.

Effectively, embodiments of the invention evaluate the phase noise of the internal oscillation system by using an additional good phase noise oscillator, and corrects the received signal by the evaluated phase noise. The additional oscillator does not have to have a precise tuning capability. So, it is generally less expensive than improving the internal oscillation system.

This additional oscillator can be either external or internal to the receiver being improved.

In certain embodiments, the DUT and additional oscillator signal are all oversampled, at a minimum, by a factor of at least 2.5. Also, in some embodiments, the DUT and reference signals are combined into one channel and digitized by a single A/D converter.

Embodiments also include methods of for reducing receiver noise in a receiver structured to accept an oscillating test signal. Such methods include receiving a second oscillating signal, sampling the test signal and the second oscillating signal to create a sampled test signal and sampled oscillating signal, measuring noise on the sampled oscillating signal, and removing an amount of noise from the sampled test signal that is approximately equal to the measured noise.

DETAILED DESCRIPTION

Figure 1:
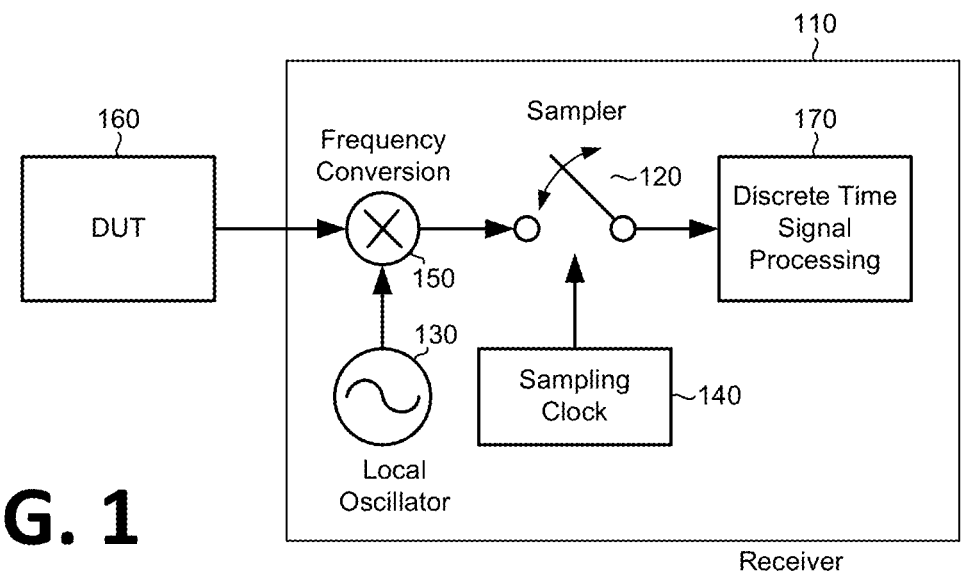
FIG. 1 is a functional block diagram of a conventional test instrument, such as a Real Time Spectrum Analyzer, that exhibits significant internal noise.

FIG. 1 is a functional block diagram of a single conversion receiver 110 intended to measure an RF signal from a Device Under Test (DUT) 160. Typically, a hold circuit and an Analog to Digital Converter (ADC) would follow a sampler 120 but are omitted to simplify the figure. Image rejection filter(s) and an anti-aliasing filter are also omitted. In FIG. 1, phase noise of both a local oscillator 130 and a sampling clock 140 degrade the phase measurement of the RF signal from the DUT 160.

Figure 2:
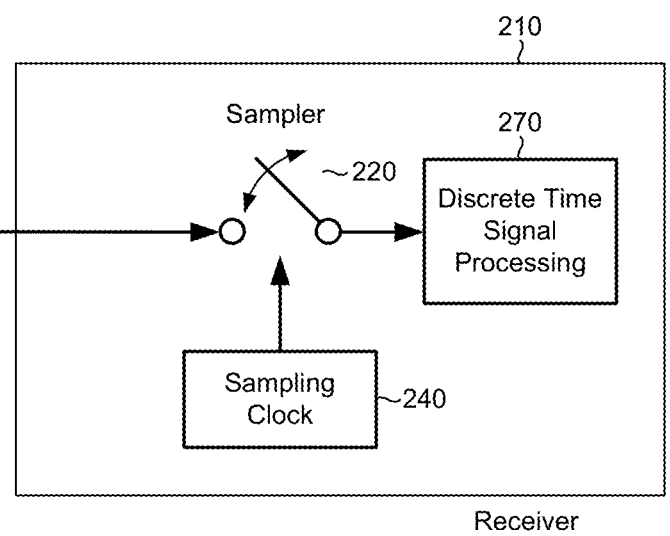
FIG. 2 is a functional block diagram of a conventional test instrument, such as a Digital Oscilloscope, that also exhibits significant internal noise.

Some receivers, such as the digital oscilloscope 210 illustrated in FIG. 2, do not include a frequency conversion stage, formed in FIG. 1 by the local oscillator 130 and frequency mixer 150. In the digital oscilloscope 210, a sampler 220, which is driven by a sampling clock 240, periodically samples signals from the DUT 260 for processing by a discrete time signal processing system 270. In the digital oscilloscope 210 of FIG. 2, even though it does not included a local oscillator, the phase noise of the system is still degraded by the sampling clock 240. The digital oscilloscope 210 of FIG. 2 would also typically include an anti-aliasing filter, which is omitted for clarity.

Figure 3:
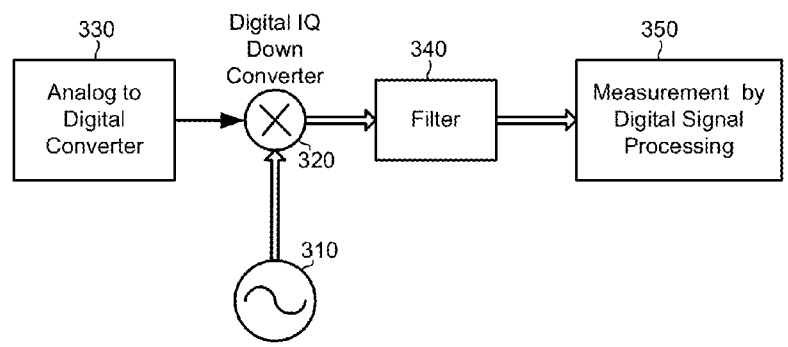
FIG. 3 is a functional block diagram of the discrete time processing portion of the instruments of FIG. 1 and FIG. 2.

FIG. 3 is a functional block diagram of the discrete time processing portions 170, 270, of the instruments illustrated in FIG. 1 and FIG. 2.

In FIG. 3, as in the remainder of the figures in this description, single lines identify the path of real signals, while double lines identify the path of quadrature (IQ complex) signals. A numerically controlled oscillator 310 operates at a frequency of the carrier frequency of the RF signal being tested. A digital IQ down-converter 320 converts the signal output from an ADC 330 to an IQ base band signal. A filter 340 extracts RF signal information from the downconverted signal, which is then measured by a digital signal processor 350, which performs measurements on the resultant signal.

Figure 4:
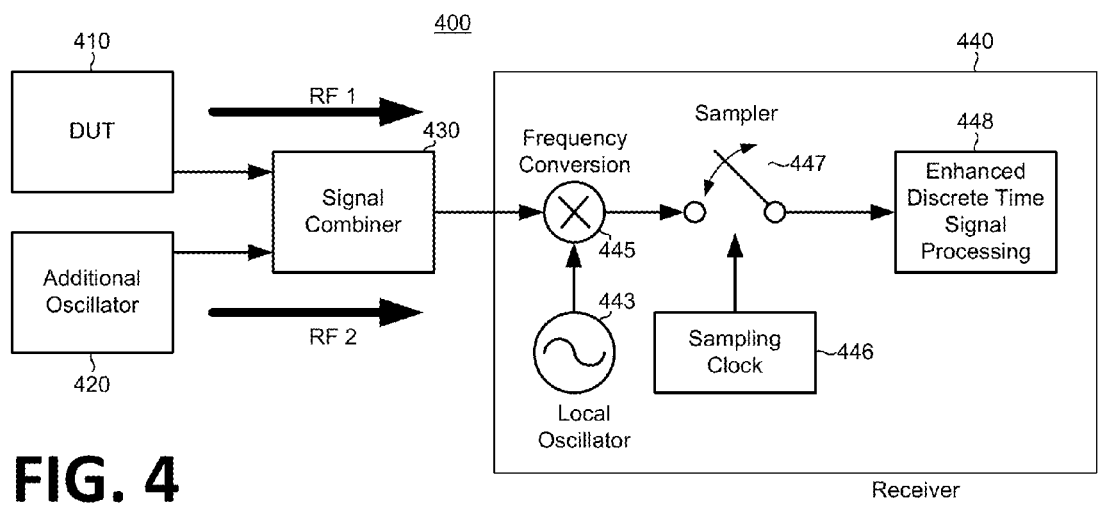
FIG. 4 is a functional block diagram of an example system using phase correction to reduce noise according to embodiments of the invention.

Embodiments of the invention use a second oscillator to enhance discrete time signal processing by using phase correction in a test measurement system. FIG. 4 shows a block diagram of a system 400 using phase correction to reduce noise according to embodiments of the invention. In the phase noise correction system 400, the signal from a DUT 410, having an RF signal output labeled RF 1 and the signal RF 2 from an additional oscillator 420 are combined in a signal combiner 430 and passed to a receiver 440. RF 2 may be an un-modulated Continuous Wave (CW), for example. The frequency of RF 2 should be known to the system and should be selected so as not to cause signal interference with RF 1. Preferably, using the same frequency for RF 1 and RF 2 is to be avoided, and harmonic relations should also be avoided when selecting the frequency for RF 2. If the two frequencies RF 1 and RF 2 are too close, the phase noise from RF 1 cannot be rejected by the filter, as explained below.

For the signal combiner 430 in FIG. 4, a 180 degree hybrid may be a good choice, although other combination methods may be used. The receiver 440 can be either with or without frequency conversion. In this example the frequency conversion is performed by a local oscillator 443 and frequency mixer 445. The additional oscillator 420 and signal combiner 430 are placed outside of the receiver 440 in this example, but they could also be included inside the receiver 440 in other embodiments.

Figure 5:
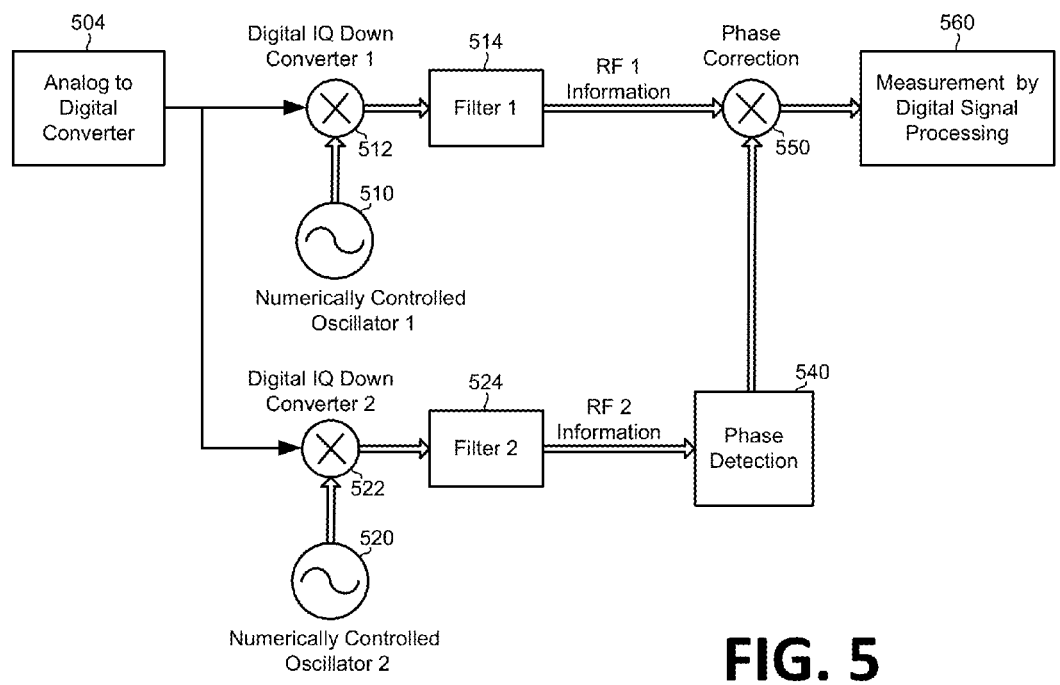
FIG. 5 is a functional block diagram of an example discrete time signal processing block of the system illustrated in FIG. 4.

FIG. 5 illustrates in more detail an example embodiment of the enhanced discrete time signal processing 448 of FIG. 4 in which the phase error correction takes place. As above with reference to FIG. 3, single lines illustrated the signal path of real signals while double lines illustrate the path of IQ complex signals.

With reference to FIG. 5, a first numerically controlled oscillator 510 is tuned to the RF 1 signal from the DUT 410 illustrated in FIG. 4. This is the same as conventional discrete time signal processing. The sampled signal RF 1 is digitized in an ADC 504 and then processed by a first digital IQ Down-Converter 512 that is controlled by the first numerically controlled oscillator 510. The first digital IQ Down-Converter 512 converts the digitized RF1 signal to a Zero IF signal (baseband IQ complex signal). The output of the first Digital IQ down-converter 512 is then filtered by a first filter 514 to extract RF 1 information only. These functions are the same as illustrated above with reference to FIG. 3. Noise reduction by phase correction according to embodiments of the invention is driven by the remaining elements within FIG. 5.

More specifically, a second numerically controlled oscillator 520 is tuned to the RF 2 signal from the additional oscillator 420 of FIG. 4. The sampled and digitized RF 2 signal is mixed with a second numerically controlled oscillator 520 and converted to a Zero IF signal (baseband IQ complex signal) by the second digital IQ Down-Converter 522. The output of the second digital IQ Down-Converter 522 is then filtered by the second filter 524 out to extract RF 2 information only.

With reference back to FIG. 4, the local oscillator 443, sampling clock 446, and sampler 447 affect both the RF1 and RF2 signals with phase noise in a similar manner. It can be assumed that the numerically controlled oscillators 510, 520 of FIG. 5 have much better phase noise than the additional oscillator 420, because the oscillators 510, 520 are produced by a math process and not hardware. The RF 2 information is ideally a constant in Zero IF, whose phase angle is, for reference, ϕ2 in IQ baseband representation. However, due to the internal phase noise of the receiver, such as the receiver 440, the actual angle becomes Φ2+ϕ2, where ϕ2 is the phase noise component from the receiver. An instantaneous phase may be detected in a phase detector 540 by, for example, processing the arc tangent of Q (imaginary) component and I (real) component. For example, suppose the carrier frequency of RF 1 is f1 and frequency of RF 2 is f2. A simple phase noise relation can be expressed as:

$$\phi 1 : f1 = \phi 2 : f2 \qquad \text{Equation 1}$$

where ϕ1 is the phase noise on RF 1 and ϕ2 is the phase noise on RF 2 added by the local oscillator and by the sampling clock, respectively. Note that ϕ1 and ϕ2 are the instantaneous phases at each sample, so the phase of RF 1 may be corrected sample by sample.

The first and second numerically controlled oscillators 510, 520 do not have to be exactly f1 and f2 for the phase correction. In this case, phase rotations are included in signals after the first and second digital IQ Down-Converters 512, 522. These phase rotations are constant rotation (frequency shifts) and can be numerically subtracted in the digital signal processing block 560 in a known manner.

With reference back to FIG. 5, a phase detector 540 detects the phase of the RF 2 signal, which may be subtracted in the phase corrector 550. In one embodiment the phase corrector 550 may remove phase noise by dividing the RF 1 information output from the first filter 514, then dividing the filtered RF 1 information by the phase angle detected and measured by the phase detector 540. Then the resultant signal, with the noise removed, is passed to the digital signal processor 560 for measurement and processing.

The phase of the RF 2 signal is a good approximation of the noise added by the local oscillator 443 and sampling clock 446. Therefore, after the noise is subtracted in the phase corrector 550, much of the noise caused by the receiver 440 (FIG. 4) is removed.

Other implementations of embodiments of the invention use a multiple channel receiver. Most oscilloscopes have more than one input channel. For example, with reference to FIG. 6, two independent channels of a receiver 640 may receive signals from a DUT 610 and from an additional oscillator 620, respectively. The samplers 617 and 627 are both driven by the same sampling clock 630 within the receiver 640. The receiver may include frequency conversion, such as the embodiment illustrated in FIG. 4, but need not include frequency conversion.

Figure 6:
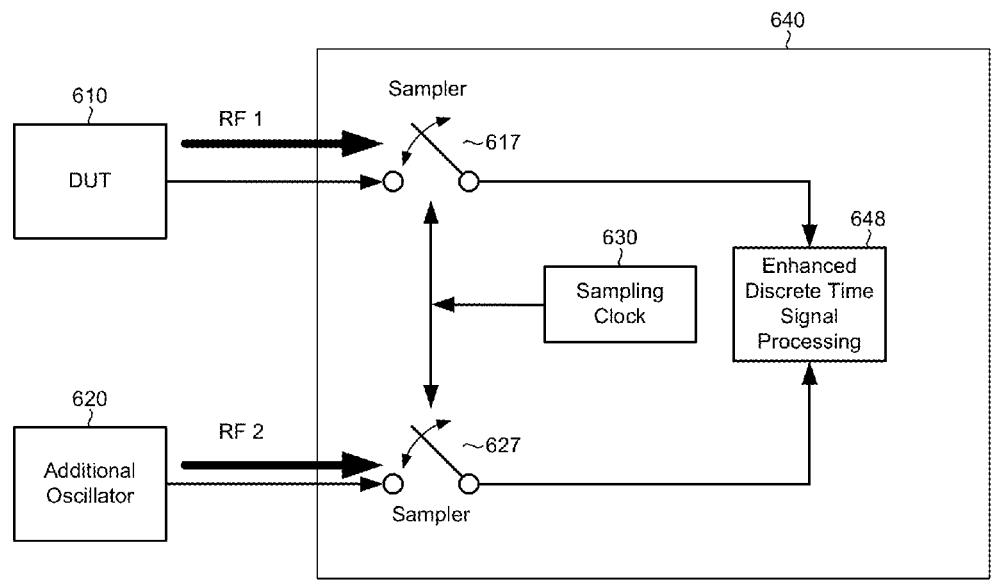
FIG. 6 is a functional block diagram of another example system using phase correction of a receiver that uses two input channels to reduce noise according to embodiments of the invention.
Figure 7:
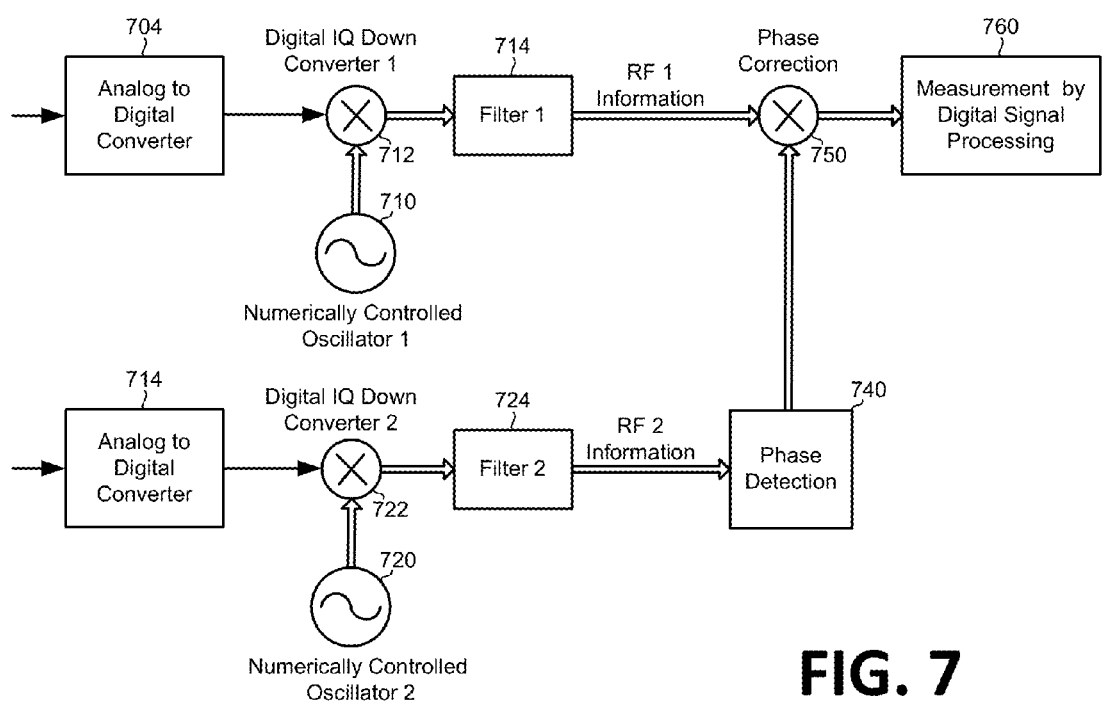
FIG. 7 is a functional block diagram of an example discrete time signal processing block of the system illustrated in FIG. 6.

FIG. 7 is a functional block diagram of an example of the enhanced discrete time signal processing block 648 of FIG. 6.

The system illustrated in FIG. 7 receives RF 1 and RF 2 signals separately. Other than including two ADCs 704, 714, each configured to receive one of the sampled signals from the DUT 610 or additional oscillator 620, the functions of the components within FIG. 7 operate in the same manner as those illustrated in FIG. 5, the description of the operation of which is omitted for brevity. In other words, by adding the additional oscillator 620 in a separate channel of the receiver, because it was processed in the same manner as the DUT 610, any phase noise from the additional oscillator may be removed from the signal from the DUT 610. This effectively removes noise caused by the receiver.

An advantage of using two channels is f2 (frequency of RF 2, the signal from the additional oscillator 620) can be the same frequency as RF 1. There are almost no restrictions on which frequency may be used for f2.

Further, with reference back to FIG. 6, if all three units, the DUT 610, the receiver 640, and the additional oscillator 620, are reference locked, the enhanced discrete time signal processing block 648 knows the exact frequency relations, which is useful because, in the case where the three are all locked, there is no need to use the additional complication of the frequency estimation calculations in the Signal Processing. Even in the case where some or all of the units may not be locked, the noise may still be reduced or eliminated by adding a frequency estimation function in the enhanced discrete time signal processing block 648 to provide the frequencies of the first and second numerically controlled oscillators 710, 720

In some embodiments the additional oscillator, such as the additional oscillator 420 of FIG. 4 or additional oscillator 620 of FIG. 6 can be a comb generator, which generates frequency tones of unmodulated Continuous Waveforms (CWs). Other oscillators may also be used.

As mentioned above, although the additional oscillators 420, 620 can be external, it is advantageous to include the oscillator inside the receiver, such as the receiver 440, 640, as a total receiver system for overall calibrations and simpler use.

The aspects of removing noise by phase detection described above can be also applied to a simple signal reception receiver for better reception quality rather than strict signal measurements.

Figure 8A:
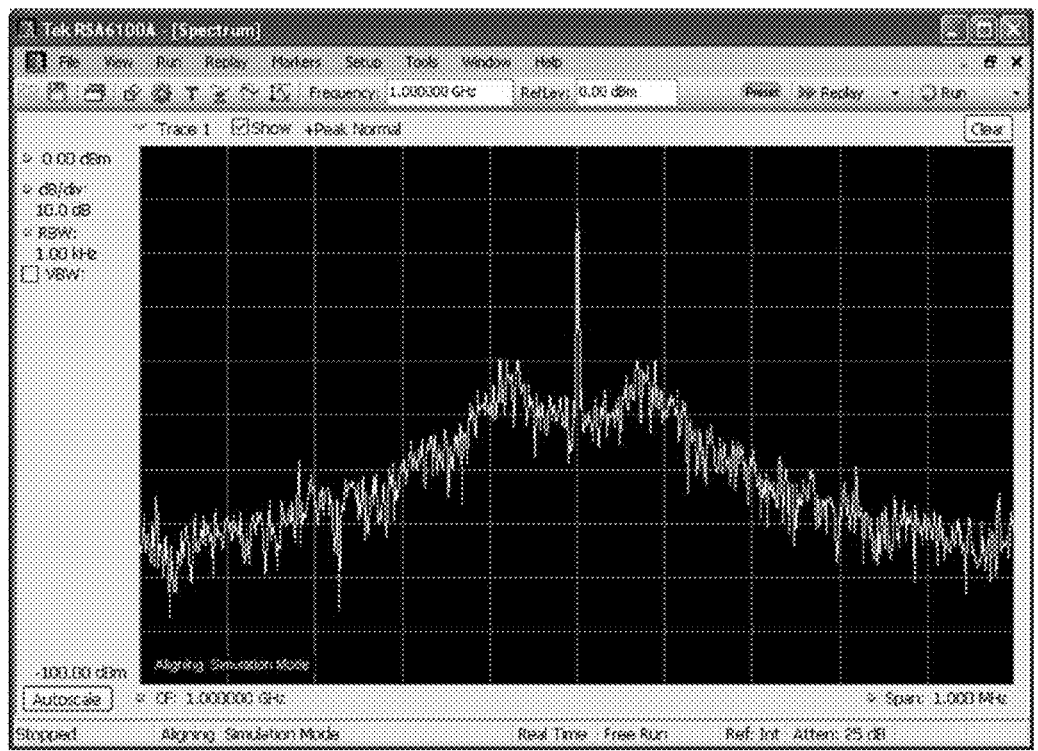
FIG. 8A is a graphical output illustrating a continuous wave waveform without phase correction.
Figure 8B:
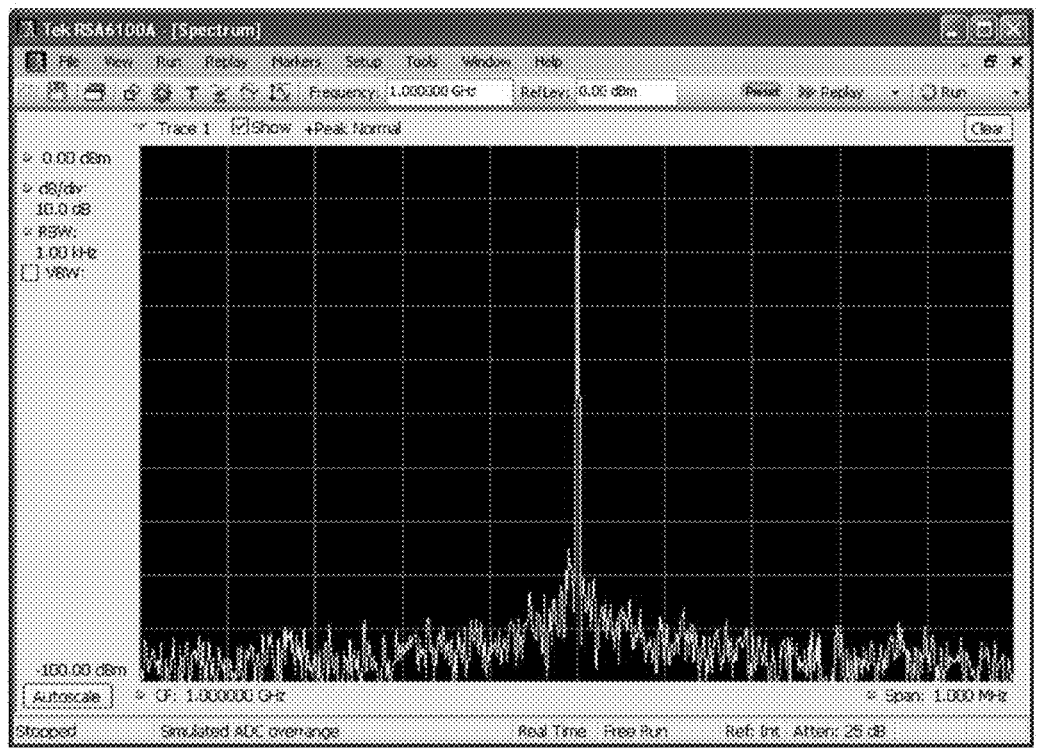
FIG. 8B is a graphical output illustrating the same continuous wave waveform of FIG. 8A after having the phase correction techniques according to embodiments of the invention applied.

FIG. 8A is a spectrogram of a reference RF signal that is a CW signal without using noise reduction, while FIG. 8B illustrates the same signal after using the phase reduction system described above. As can be easily seen, the noise floor illustrated in FIG. 8B is much lower than that illustrated in FIG. 8A.

Figure 9A:
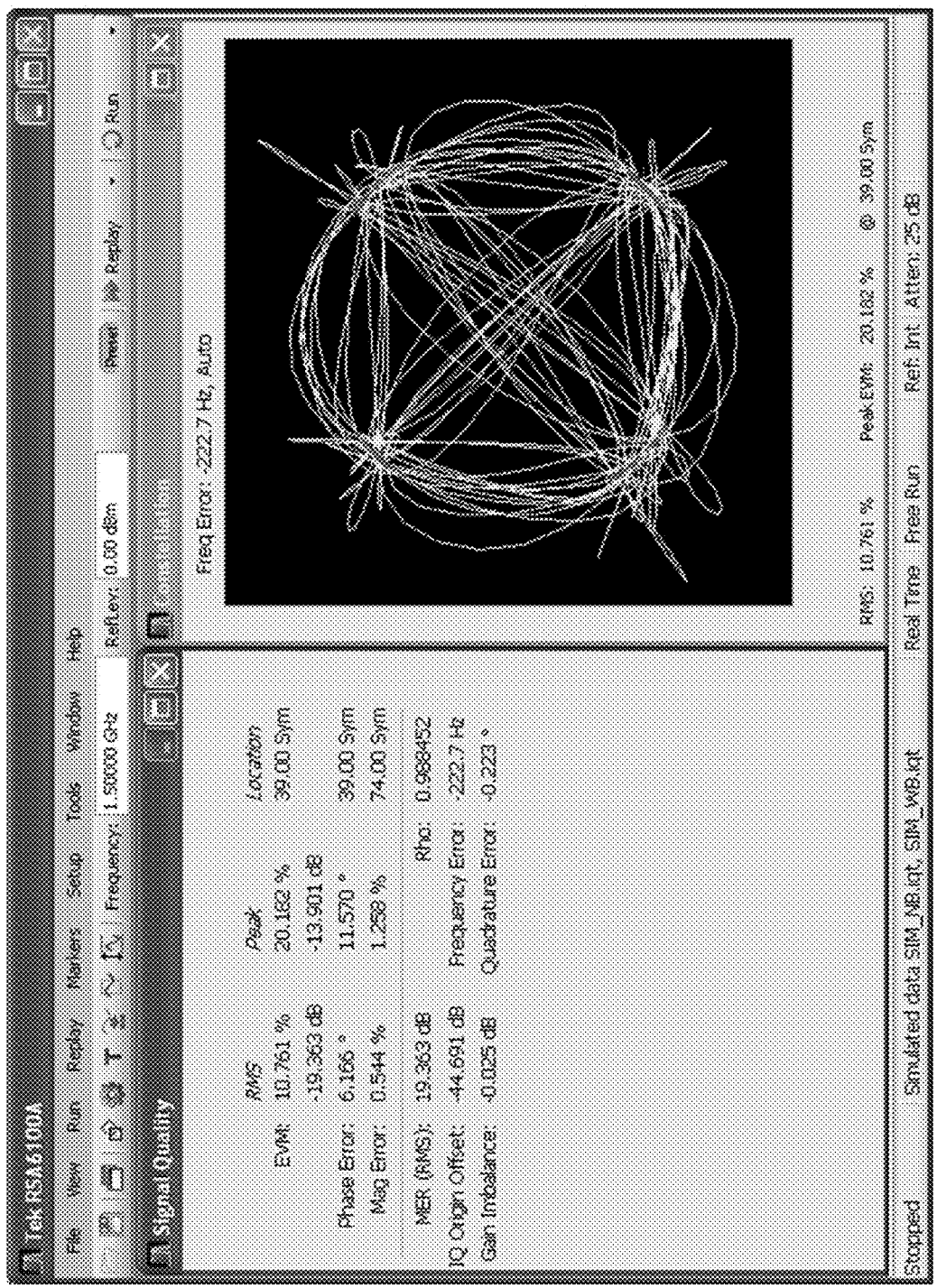
FIG. 9A shows a constellation signal and quality of Quadrature Phase Shift Keying (QPSK) without phase correction.
Figure 9B:
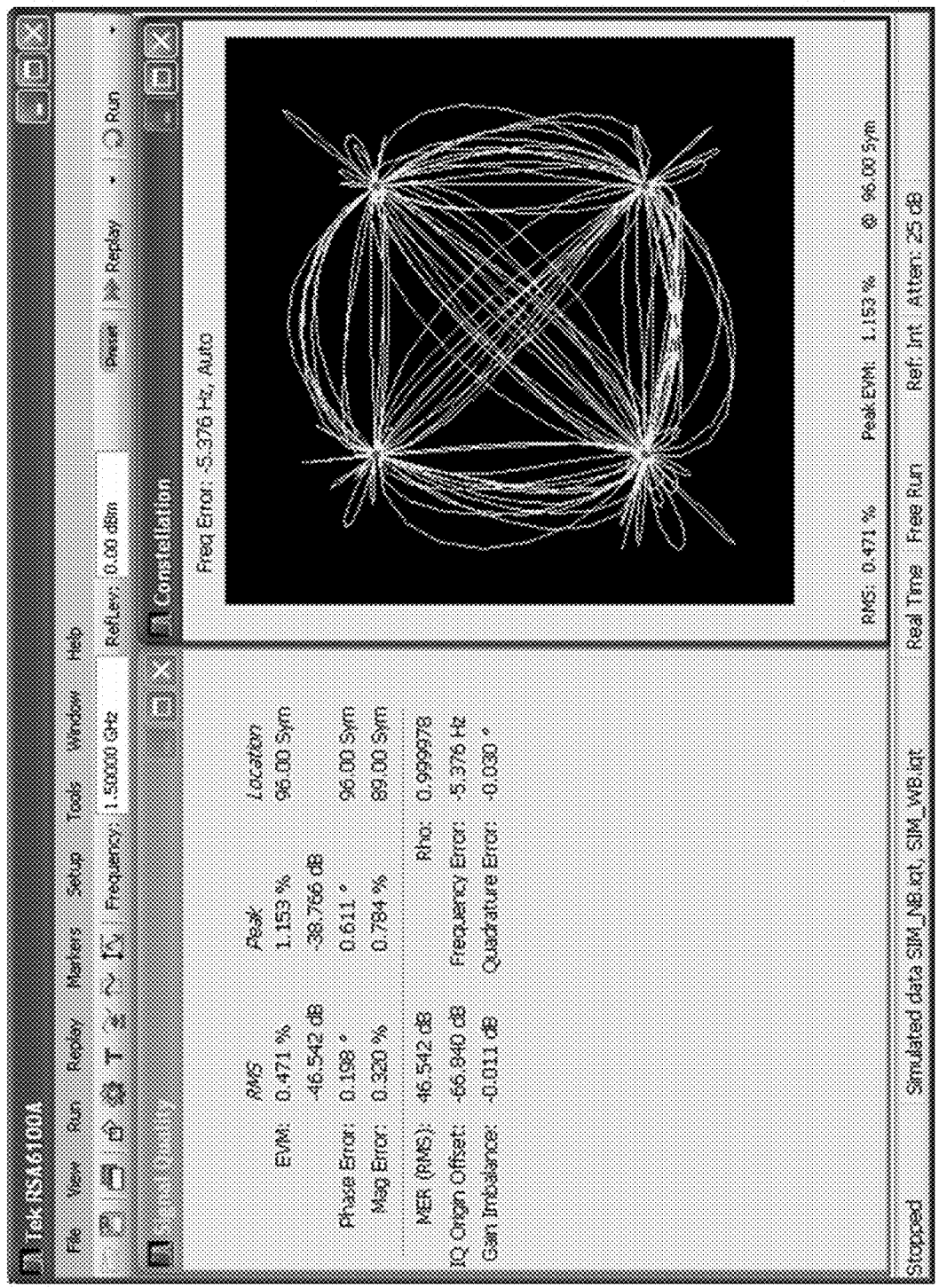
FIG. 9B shows the constellation signal and QPSK after having the phase correction techniques according to embodiments of the invention applied.

FIGS. 9A and 9B illustrate the results of implementation of the above-described noise reduction system experiments on QPSK modulated signals captured by a TEKTRONIX MSO5000 oscilloscope. The QPSK signals were analyzed by RSA6000 software.

The constellation and signal quality measurements illustrated in FIG. 9A shows a constellation and signal quality of QOSK without the phase correction. In FIG. 9A, the highlighted areas in the corners illustrated the problem with phase noise at the symbol points. The measured Error Vector Magnitude (EVM) is a relatively high 10.761%.

Instead, with phase correction applied, as illustrated in FIG. 9B, the corresponding highlighted areas are reduced to well concentrated dots, and the measured EVM is a relatively low 0.471%.

Although specific embodiments of the invention have been illustrated and described for purposes if illustration, it will be understood that various modifications may be made without departing from the spirit and scope of the invention. Accordingly, the invention should not be limited except as by the appended claims.

What is claimed is:

1. A test and measurement instrument comprising:
   a test signal input for receiving a signal for testing;
   a sampler coupled to the test signal input and structured to generate a sampled test signal from the signal for testing; and
   a noise reduction system including:
   an additional oscillator coupled to the sampler and structured to generate a sampled oscillating signal,
   a phase detector coupled to the sampled oscillating signal and structured to measure an amount of noise introduced by the sampler in the sampled oscillating signal, and
   a phase corrector coupled to the phase detector and to the sampled test signal, the phase corrector structured to remove the amount of noise measured in the sampled oscillating signal from the sampled test signal.

2. The test and measurement instrument of claim 1, further comprising a frequency converter coupled between the test signal input and the sampler, the frequency converter driven by a local oscillator, and in which the phase detector is structured to measure noise introduced by the sampler and by the local oscillator.

3. The test and measurement instrument of claim 2, further comprising a signal combiner structured to combine a device under test signal with the sampled oscillating signal for input as the signal for testing.

4. The test and measurement instrument of claim 1, in which the phase detector is structured to measure the amount of noise as a phase angle in a sampled IQ pair.

5. The test and measurement instrument of claim 4 in which the phase corrector is structured to remove phase noise of an IQ signal, derived from the sampled test signal, based on the phase angle measured by the phase detector.

6. The test and measurement instrument of claim 1, in which the additional oscillator is a comb generator.

7. The test and measurement instrument of claim 1, in which the additional oscillator is contained within the test and measurement instrument.

8. A receiver comprising:
a first channel input for receiving a test signal;
a second channel input for receiving an oscillator signal from an additional oscillator;
a first sampler coupled to the first channel input for generating a sampled test signal;
a second sampler coupled to the second channel input for generating a sampled oscillating signal from the oscillator signal, the first and second samplers driven by a common sampling clock; and
a noise reduction system including:
  a phase detector coupled to the sampled oscillating signal and structured to measure an amount of noise introduced by the second sampler in the sampled oscillating signal, and
  a phase corrector coupled to the phase detector and to the sampled test signal, the phase corrector structured to remove the amount of noise measured in the sampled oscillating signal from the sampled test signal.

9. The receiver of claim 8, in which the phase detector is structured to measures noise as a phase angle in a sampled IQ pair.

10. The receiver of claim 9 in which the phase corrector is structured to remove phase noise of an IQ signal, derived from the sampled test signal, based on the phase angle measured by the phase detector.

11. A method of reducing phase noise in a receiver structured to accept an oscillating test signal, the method comprising:

receiving an additional oscillating signal from an additional oscillator;
sampling, by the receiver, the additional oscillating signal to create a sampled oscillating signal;
sampling, by the receiver, the oscillating test signal to create a sampled test signal, wherein the sampling of the additional oscillating signal and the sampling of the oscillating test signal are performed utilizing a common sampling clock;
measuring phase noise of the sampled oscillating signal using a phase detector; and
removing an amount of phase noise from the sampled test signal based on the phase noise measured from the sampled oscillating signal using a phase corrector.

12. The method of claim 11 in which measuring phase noise of the sampled oscillating signal comprises measuring a phase angle in an IQ pair generated from the sampled oscillating signal.

13. The method of claim 12 in which removing an amount of noise from the sampled test signal comprises performing phase correction on an IQ pair generated from the sampled test signal based on the phase angle.

14. The method of claim 11 in which sampling the oscillating test signal and the additional oscillating signal comprises sampling the oscillating test signal with a first sampler and sampling the additional oscillating signal by a second sampler.

* * * * *